EVAPORATION-FUSED JUNCTION SEMICONDUCTOR DEVICES

Filed Feb. 25, 1955 2 Sheets-Sheet 1

JOSEPH MASERJIAN
INVENTOR.

BY Henry Heyman
ATTORNEY

JOSEPH MASERJIAN
INVENTOR.

BY Henry Heyman

ATTORNEY

United States Patent Office 2,789,068

Patented Apr. 16, 1957

2,789,068

EVAPORATION-FUSED JUNCTION SEMICONDUCTOR DEVICES

Joseph Maserjian, Los Angeles, Calif., assignor to Hughes Aircraft Company, a corporation of Delaware Application February 25, 1955, Serial No. 490,599

8 Claims. (Cl. 148—1.5)

The present invention relates to semiconductor devices, and more particularly, to fused junction semiconductor signal translating devices having a broad area P–N junction, and to a method of producing broad area fused junction semiconductor devices.

In the semiconductor art, a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous solid specimen of semiconductor material has an N-type region adjacent a P-type region, the boundary between the two regions is termed a P–N (or N–P) junction, and the specimen of semiconductor material is termed a P–N junction semiconductor device. Such a P–N junction device may be used as a rectifier. A specimen having two N-type regions separated by a P-type region, for example, is termed an N–P–N junction semiconductor device or transistor, while a specimen having two P-type regions separated by an N-type region is termed a P–N–P junction semiconductor device or transistor.

The term, "monatomic semiconductor material," as utilized herein is considered generic to both germanium and silicon, and is employed to distinguish these semiconductors from metallic oxide semiconductors, such as copper oxide and other semiconductors consisting essentially of chemical compounds.

The term, "active impurity," is used to denote those impurities which affect the electrical rectification characteristic of monatomic semiconductor material, as distinguishable from other impurities which have no appreciable effect upon these characteristics. Active impurities are ordinarily classified either as donor impurities—such as phosphorus, arsenic, and antimony—or as acceptor impurities, such as boron, aluminum, gallium, and indium.

The term, "solvent metal," is used in this specification to describe those metals which, when in the liquid state, become solvents for the semiconductor material which is under consideration, and will therefore dissolve areas of semiconductor material which are in contact with the solvent metal. A solvent metal may be a primary element or it may be an alloy.

In the prior art method of producing a fused P–N junction in a semiconductor body, a metal specimen, ordinarily in pellet form, containing a solvent metal and including either an acceptor or a donor impurity, is melted or fused onto one surface of a heated semiconductor body, forming a molten drop which dissolves a small portion of said body, the dissolved portion of the semiconductor body forming an alloy solution with the molten metal specimen. Ordinarily the metal specimen has a relatively low melting point or at least a low eutectic temperature with the semiconductor material, this being desirable so that fusion can be effected readily without raising the temperature of the semiconductor body to values that might injure the electrical characteristics of the semiconductor body. To form the junction region, the assembly which comprises the semiconductor body and the drop of molten solvent metal is allowed to cool.

As the temperature drops, the solubility of the dissolved semiconductor material in the solvent metal drop decreases and, as a result, some of the dissolved semiconductor material, together with some atoms of the active impurity contained in the solvent metal specimen, begins to precipitate out of the liquid metal solution, depositing preferentially on the parent semiconductor crystal body to form a regrown crystal region of opposite conductivity type to that of the parent crystal. As the temperature is further decreased, the remainder of the solvent metal and dissolved semiconductor material solidifies as an alloy button affixed to the regrown region. By repeating or simultaneously performing the described process on opposite surfaces of the semiconductor body, a P–N–P or N–P–N junction transistor is produced.

As is well known to one skilled in the art, however, the fusion techniques heretofore known to the art, such as the one described above, have several inherent limitations which, in turn, limit the production of fused junction semi-conductor devices. For example, the practice of the above method is restricted to the use of solvent metals which are fairly soft in a solid state and/or which do not differ greatly in their thermal coefficients of expansion from that of the semiconductor material. If solvent metals which do not satisfy these criteria are used, the parent crystal is usually cracked or crazed at the junction region by the alloy button as it solidifies, which seriously impairs the electrical characteristics of the final semiconductor device.

Several improved methods of producing fused junctions in semiconductor devices have been disclosed, for example, in copending United States patent applications, Serial No. 303,626 for "Junction Type Semiconductor Devices," by S. H. Barnes et al., filed August 9, 1952, now U. S. Patent No. 2,742,383, issued April 17, 1956; Serial No. 393,038 for "Fused Junction Semiconductor Devices," by J. N. Carman et al., filed November 1953; Serial No. 417,081 for "Fused Junction Transistors With Regrown Base Regions," by J. N. Carman, filed March 18, 1954; and Serial No. 479,316 for "Fused Junction Semiconductor Devices," by R. A. Gudmundsen, filed January 3, 1955, all assigned to the assignee of the present application.

Although this fusion process and the other improved fusion processes disclosed in the above copending applications have been eminently successful for producing P–N junctions, they have, in comon with the other fusion processes heretofore known to the art, the serious limitation that they cannot produce a large-area fused junction. The reasons for the limitation in area of the fused junction produced by these fusion processes and fusion processes heretofore known to the art are well known to those skilled in the art. Primarily, these difficulties arise from the fact that in fusing a pellet of alloying metal to the parent semiconductor crystal, the substantial thickness of the pellet creates strains which, in turn, cause crazing and fissures in the semiconductor crystal body.

Various attempts have been made to produce a broad area junction by fusing a relatively thin film of solvent metal with the surface of the semiconductor crystal. However, the attempted processes have not been practical and have met with difficulties which have not heretofore been overcome. For example, a P-type gas—boron tetrachloride—has been passed over hot silicon while the temperature of the silicon has been maintained at 1300° C. to cause diffusion of boron into the parent semiconductor crystal body. However, the time required for sufficient diffusion to take place in order to create a P–N junction is on the order of hundreds of hours, thus making this process obviously impractical for production uses. In addition, this method results in a reduction of lifetime of the carriers in the semiconductor devices.

Another method which attempts to solve the limitation of P–N junction area is the crystal-pulling technique in which a seed crystal of semiconductor material of one conductivity type is withdrawn from a melt of the base semiconductor material, the constituency of which is changed during the crystal growing process to produce P–N junctions in the ingot. This prior art method of producing broad area P–N junctions has several inherent limitations. As is well known, if the semiconductor crystal changes from N-type to P-type in a relatively gradual manner, as is common in grown junctions, the charge density is proportional to the distance away from the junction. Further, the method is not readily adapted to mass production because of the relatively slow rates at which the crystal must be drawn and the relatively precise process control required to regulate the thickness of the base region and to prevent the formation of lattice defects in the crystal. The base impedance of this type of P–N junction when used in a transistor is usually relatively high in comparison to the base impedance of junction transistors produced by the fusion process. In addition, the frequency responses of the transistors produced by this prior art method is relatively lower in comparison with point contact transistors, for example.

In addition to the above recited difficulties encountered in producing broad area P–N junctions in germanium and silicon semiconductor bodies, further difficulties are encountered when silicon is used as a parent crystal. It has long been recognized in the semiconductor art that silicon has many physical advantages over germanium, in particular its ability to operate at relatively high temperatures. Nevertheless, the production of fused junction silicon semiconductor devices has been difficult owing to the fact that the production techniques which have been found suitable for producing fused junction germanium semiconductor devices are not readily adapted to the production of fused junction silicon semiconductor devices. More particularly, the production of fused junction silicon semiconductor devices has been complicated by the fact that it is difficult to make a good ohmic electrical connection to silicon. Thus, it has been found that the more conventional techniques employed for connecting to germanium produce relatively high impedance connections with silicon, which in many instances are asymmetrically conductive or rectifying. Further, the inherent tendency of silicon toward rapid formation of an extremely hard and stable oxide has rendered it difficult to create fused junction silicon devices because of the inability of the active impurity employed in the fusion process to wet the adjacent surface of the silicon.

The desirability of broad area P–N junctions in semiconductor devices is apparent and well known to those skilled in the art. The most serious limitation in semiconductors in the prior state of the art has been the limitation in current-carrying capabilities which has, in turn, been due to the small area of the rectifying junction or P–N junction which it has been heretofore possible to produce. This is true inasmuch as the current-carrying capacity of the semiconductor device having maximum charge densities at the rectifying barrier is proportional to the area of the rectifying barrier.

Accordingly, it is an object of the present invention to provide a method of producing P–N junctions having a broader area than has heretofore been possible in the prior state of the art.

It is another object of the present invention to provide semiconductor devices having P–N junction areas which are not limited in area except by the size of the monatomic semiconductor crystal which is available.

It is another object of the present invention to provide a method of producing rectifier barriers in monatomic semiconductor crystal bodies which is simple and lends itself to mass production.

It is another object of the present invention to provide a fusion method of producing a broad area P–N junction which is accurately controllable.

It is a further object of the present invention to provide a method of producing broad area P–N junctions upon semiconductor crystal bodies which may be later divided to produce a plurality of rectifying crystals for semiconductor devices.

It is a further object of the present invention to provide a method of producing broad area P–N junctions for semiconductor devices which are capable of carrying large currents.

Still another object of the present invention is to provide silicon diodes having a rectifying barrier of sufficiently large area to allow the use of the silicon diodes for high power applications.

Still a further object of the present invention is to provide an efficient, reliable, reproducible, economical, and predictable fusion method of producing broad area P–N junctions.

It is a still further object of the present invention to provide a method of producing a broad-area ohmic connection on a silicon body.

The method of the present invention comprises the steps of heating a monatomic semiconductor crystal body of a predetermined conductivity type; evaporating a mass of solvent metal, including an active impurity of the type which will convert the body to the desired conductivity type, onto the surface of the semiconductor body to form a molten layer of substantial thickness of the solvent metal upon the surface of the body and to dissolve a layer of the surface of the semiconductor body in the molten layer of solvent metal; and cooling the semiconductor body to cause the dissolved semiconductor material to reprecipitate, together with some atoms of the active impurity, upon the semiconductor body to form an integral regrown crystal region of opposite conductivity type to the semiconductor body. The present method may also be utilized to create a superior ohmic contact on the semiconductor body.

The novel features which are believed to be characteristic of the invention, both as to its organization and method of operation, together with further objects and advantages thereof, will be better understood from the following descripton considered in connection with the accompanying drawings in which several embodiments of the invention are illustrated by way of example. It is to be expressly understood, however, that the drawings are for the purpose of illustration and description only and are not intended as a definition of the limits of the invention.

Figure 5:
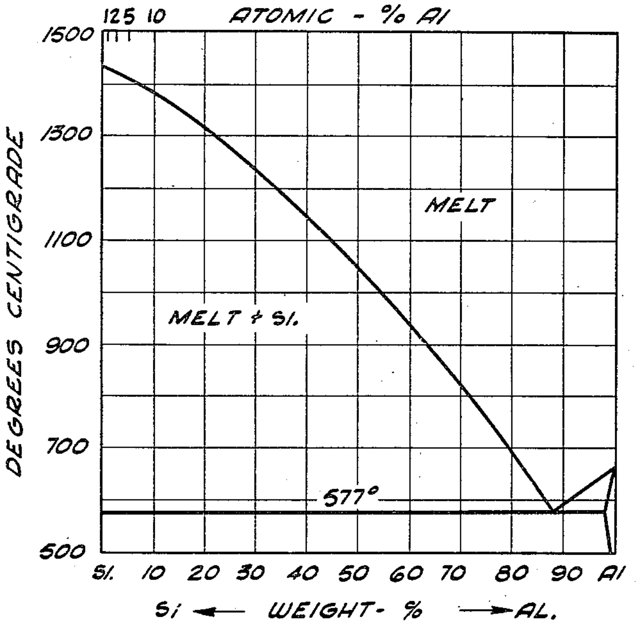
Figure 6:
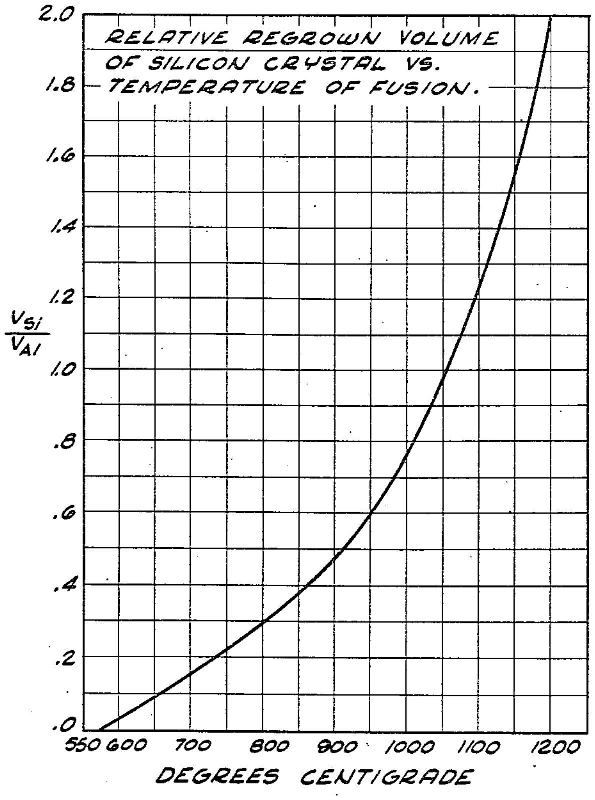

Fig. 5 is a binary phase diagram which illustrates the liquid-solid equilibrium phase relationship between aluminum and silicon for a range of temperatures between 500° C. and 1450° C.; and Fig. 6 is a graph illustrating the ratio between the volume of the silicon regrown crystal region and the volume of aluminum evaporated onto the silicon surface versus the fusion temperature used in the method of the present invention.

It has been found that by the method of the present invention, it is possible to produce diodes of which the following types are illustrative: high forward conductance diodes having forward current carrying capacities in the range from 20–200 ma. at 1 volt and a power output of approximately 20 watts; medium power rectifiers, having forward current carrying capacities of .5 to 2 amps and a power output of 100 watts; moderate power rectifiers having forward current carrying capacities of five to ten amps and a power output of 500 watts; and high power rectifiers having current carrying capacities of 100 amps with a power output of 5,000 watts. Similarly improved and high current carrying transistors, photocells, and other semiconductor devices may be obtained by the method of the present invention for forming fused junctions in semiconductor bodies.

Vapor deposition of donor and acceptor impurities has been utilized in the prior art to produce ohmic connections to semiconductor bodies as disclosed by U. S. patent application, Serial No. 387,274, for "Junction Type Semiconductor Devices," by Harvey Stump, filed October 1953, assigned to the assignee of the present application, and to produce P–N junctions by diffusion of a relatively thin film of donor or acceptor impurity, as disclosed in U. S. Patent 2,695,852, for "Fabrication of Semiconductors for Signal Translating Devices," by M. Sparks, issued November 30, 1954. However, the prior art does not teach or disclose the possibility of producing large area fused P–N junctions which are made possible by the method of the present invention. Unlike the above vapor-deposition methods, the method of the present application provides a means for forming broad area fused planar P–N junctions heretofore not possible by methods of the prior art by observing critical parameters which will be described in greater detail hereinafter. Briefly, the method of the present invention utilizes a layer of molten solvent metal of substantial thickness which is deposited upon the surface of a semiconductor crystal body under accurately defined conditions and temperature to cause dissolution of a portion of the semiconductor body followed by regrowth to form an integral regrown crystal region of the desired conductivity type. In accordance with U. S. Patent 2,695,852, described above, and similar methods of the prior art, a P–N junction is obtained by diffusion of an active impurity into the semiconductor crystal body. Hence, the Sparks patent does not disclose or teach the deposition of a molten layer of substantial thickness upon a surface of a semiconductor crystal body at the temperature range and under the prescribed conditions, described in detail hereinafter, which are necessary in the method of the present invention to obtain a broad area fused P–N junction.

Figure 1:
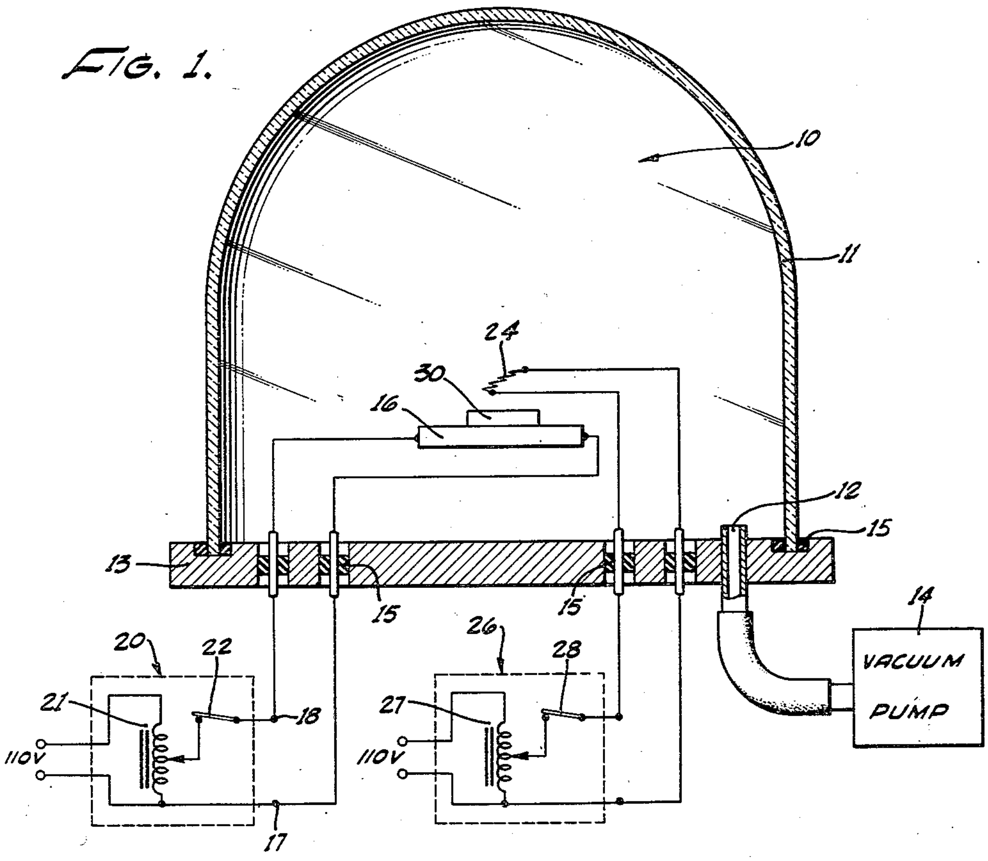
Fig. 1 is a schematic diagram, partly in section, of one form of apparatus for producing fused junction semiconductor devices according to the present invention.

Referring now to the drawings wherein like reference characters designate like or corresponding parts throughout the several views, there is shown in Fig. 1 one form of apparatus for producing fused junction semiconductor devices according to the method of this invention. The apparatus comprises a vacuum chamber 10, defined by a bell jar 11 and a base 13, having an exhaust port 12 therethrough to which a vacuum pump 14 is connected. Positioned within the chamber 10 is a heating platform 16 which may be supported within the chamber by any suitable supporting means, not shown for purposes of clarity. The platform 16 in the presently preferred embodiment of this invention is a graphite heating element, which is connected outside of the chamber 10 to two output terminals 17, 18, respectively, of an electrical power source 20.

The electrical power source 20 may include any conventional electrical circuit which is controllable for supplying a predetermined amount of electrical energy to the graphite heating plate 16. As shown in Fig. 1, for example, power source 20 includes an auto-transformer generally designated 21 which is connected across a 110-volt alternating current source, as indicated, and to a switch 22 through which a potential output from auto transformer 21 may be applied to the heating platform 16.

Positioned within the bell jar 11 above the heating platform 16 is a resistance heating filament 24 connected to a second electrical power source 26 which is again any conventional electrical circuit which is controllable for supplying a predetermined amount of electrical energy to the resistance heating filament 24. The second power source 26 also includes an auto transformer 27 which is connected across a 110-volt alternating current source and the output which may be connected to filament 24 through a switch 28.

For purposes of illustration, the operation of the apparatus shown in Fig. 1 will be described with respect to the production of a fused silicon P–N junction in which the semiconductor crystal body is N-type silicon, while the regrown region is P-type. It will be recognized, however, that the operational steps to be described may also be employed for producing fused germanium P–N junctions and P–N junctions in both silicon and germanium in which the semiconductor crystal body is P-type and the regrown region is N-type.

In producing a fused P–N junction in silicon by the method of the present invention, aluminum is used in the preferred embodiment as a combined solvent metal and active impurity. In addition to being an acceptor impurity, aluminum allows a wide tolerance in the temperatures used in the method and exhibits very little diffusion in the silicon, thereby providing a clearly defined P–N junction. Although aluminum is used as a combined solvent metal and active impurity in the present embodiment described hereinafter, it will be apparent to those skilled in the art that other solvent metals—for example, gold, platinum, silver, and tin—may be used when combined with the proper active impurity. The solvent metal may be a primary element or an alloy which has a relatively low melting point or at least a low eutectic temperature with the semiconductor material, and must be a metal capable of forming an eutectic alloy with the silicon or germanium which is used as the semiconductor material. The active impurities which may be used in the present method are those ordinarily classified either as donor impurities, including phosphorus, arsenic, and antimony, or as acceptor impurities, including aluminum, gallium, and indium. The solvent metal and active impurities will be determined by the conductivity type of the crystal region to be regrown, for example, an alloy of gold and antimony may be used for N-type regrown regions on P-type bodies.

Referring to Fig. 1, an N-type silicon body 30 is preferably a silicon single crystal which has been cut to a slab of predetermined thickness and which has been crystallographically oriented so that its upper and lower surfaces, as viewed in Fig. 1, are the (111) surface planes of the crystal. The semiconductor body may be of any desired area which is most generally determined by the size of the parent single crystal from which the slab is cut. In the present embodiment, a silicon body approximately ½" in diameter is used. Crystallographic orientation of the specimen is not necessary but is desirable to promote the growth of planar P–N junctions within the specimen during the fusion operation which will be described hereinafter. At the present, it appears to be preferable to employ the (111) surface plane for carrying out the method of this invention, the theory being that the relatively high atomic density of the crystal on this particular plane permits better control of subsequent operations. It should be pointed out, however, that other relatively dense crystallographic surface planes, such as the (110), (100), and (112) plane, may be employed satisfactorily in carrying out the methods of this invention.

The silicon semiconductor body 30 is lapped to a predetermined thickness, for example, of the order of .025 of an inch, to remove surface damage produced by the cutting operation and to provide a specimen of uniform thickness. One commercially available lapping compound which has been satisfactorily employed for performing the lapping operation is 302 mesh Alundum abrasive. After the lapping operation has been performed, the semiconductor body is preferably etched in any one of several suitable etchants known to the art to remove surface imperfections. The etching step may be carried out, for example, by immersing the semiconductor body for thirty seconds in a solution containing equal parts of nitric acid, hydrochloric acid, and acetic acid. The wafer is then rinsed in distilled water, followed by a second rinse in absolute methyl alcohol.

With the bell jar 11 removed, the semiconductor body 30 is placed upon the heating platform 16 which is a graphite heating element. Graphite is selected as the material for the heating platform 16 because of its relative lack of chemical activity with silicon at elevated temperatures.

The resistance heating filament 24 is positioned within the evacuated chamber 10 approximately ½ inch above the upper surface of the semiconductor body 30. The filament presently used is saw toothed in form lying in a plane substantially parallel to the plane of the surface of the semiconductor body, and is made from triple strand 20-mil diameter tungsten wire. A predetermined quantity of aluminum, determined as described hereinafter, is placed on the filament by winding the saw tooth portion of the filament with 12 inches of 16 mil diameter aluminum wire. Although a tungsten filament is utilized in this embodiment, other means will be wet by the solvent metal and which may be heated to evaporate the solvent metal therefrom may be used.

The bell jar 11 is then placed upon the base 13 where the chamber is sealed by gaskets 15, and the chamber is evacuated to a pressure of less than $10^{-4}$ milliameters mercury. The graphite heating platform is raised to a temperature of about 800° C. by means of the source of electric current. The time required to raise the heating platform 16 and silicon body to the desired temperature is not critical, although in this embodiment of the present method about 20 minutes is required, at which time the upper surface of the silicon semiconductor body is at a temperature of approximately 800° C.

After the heating platform has attained the required temperature, current is passed through the tungsten filament 24 to raise its surface to a temperature sufficient to melt the aluminum and to cause the aluminum to wet the tungsten wire, thus forming a molten coating of aluminum upon the wire. In practice, approximately 20 amps of current is passed through the tungsten wire until the surface of the tungsten is fully wetted and appears to glow with an orange-red color, indicating a probable surface temperature for the filament of about 900° C. When the tungsten filament appears to be completely wetted and uniformly coated by the aluminum, the current in the filament is increased, for example, to 30 amps. It may then be seen that the filament becomes incandescent to a brilliant white light and within about 10 seconds substantially all of the aluminum is evaporated from the tungsten filament. This is evidenced by the reappearance of the triple strands which were formerly concealed by the uniform surface of the melted aluminum. The filament current and heating platform current are then switched off and the semiconductor body is allowed to cool within the evacuated chamber at a controlled cooling rate of approximately 0.2° C. per second until the heating platform reaches the temperature of approximately 200° C. The semiconductor body is then removed from the evacuated chamber and allowed to cool at room temperature. Although the semiconductor body may be cooled at a faster rate or by uncontrolled cooling, it has been found that if cooling is carried out too rapidly, the film of aluminum will tend to separate from the semiconductor body due to the expansion differences of the silicon body and the solvent metal.

Figure 2:
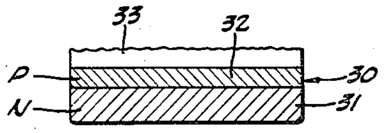
Fig. 2 is a sectional schematic diagram of a fused junction semiconductor body illustrating the appearance of the regrown crystal region.

Referring now to Fig. 2, Fig. 2 illustrates schematically a semiconductor body obtained by the method described above. As the aluminum is evaporated from the filament, it forms a film of molten aluminum upon the upper surface of the N-type silicon body which is at a temperature of approximately 800° C. Since the temperature of the silicon surface is above the eutectic temperature for aluminum-silicon alloy, the molten aluminum will dissolve a substantial portion of the silicon with which it is in contact. As the silicon body is allowed to cool, the solubility of the silicon in the molten aluminum decreases and, as a result, some of the dissolved silicon, together with some atoms of the aluminum which acts as the acceptor active impurity, begins to precipitate out of the liquid aluminum-silicon solution, depositing preferentially on the parent N-type silicon body portion 31 to form a regrown P-type silicon region 32. As the temperature is further decreased, the remainder of the aluminum and dissolved silicon solidifies as a layer of eutectic aluminum-silicon alloy 33, which is ohmically connected to the P-type regrown region. The P-type regrown silicon region covers the surface area of the semiconductor body 30, thus giving a fused P–N junction equal in area to the surface area of the semiconductor crystal used in the process. Thus, the only limitation in size of the P–N junction which may be produced by the present method is the size of the parent semiconductor crystal available. The method of the present invention described above has been utilized to produce P–N junctions of the order of 1¾″ in diameter. The fused P-N junctions so produced exhibit excellent electrical characteristics as will be illustrated in more detail hereinafter in connection with the description of the production of two semiconductor devices produced by the method of the present invention. As will be apparent to those skilled in the art, the current-carrying capabilities of semiconductor devices may be greatly enlarged over those devices heretofore known to the art, since the amount of current which may be carried is proportional to the area of the P–N junction for a given current density.

In the embodiment described above in which the single crystal silicon body 30 is about .025″ in thickness and ½″ in diameter, and the amount of aluminum evaporated corresponds to the amount of aluminum contained in 12″ of 16 mil diameter aluminum wire, the thickness of the molten aluminum deposited on the surface of the silcon body 30 is approximately 1 mil and results in a regrown or P-type region substantially equal to ⅓ mil. The rate of evaporation of the aluminum at the temperatures and currents given is about 1/10 mil/sec. The distance of the filament above the upper surface of the semiconductor body for a given amount of aluminum determines the thickness of aluminum deposited on the surface and the optimum distance for a given application may be readily determined by one skilled in the art.

Micro-photographs of a sectioned fused junction semiconductor body produced by this method show the interface of the P–N junction to be planar and excellently defined.

In practicing the present method, using semiconductor bodies of proper equality, parameters which have been found to be critical in order to yield optimum and reproducible results are: the temperature of the surface of the semiconductor body; the thickness of the molten film of solvent metal and active impurity evaporated onto and deposited on the surface of the semiconductor body; and the rate of evaporation of the solvent metal and active impurity onto the surface. The rate of cooling after evaporation and fusion is not critical to the same degree as are the above parameters; however, for optimum use of the method and to obtain reproducible uniform quality of junctions, the rate of cooling should be controlled and be substantially equal when the method is repeated.

Referring to Figs. 5 and 6, the amount of silicon which will be dissolved by the molten solvent metal is dependent upon the quantity of molten aluminum present on the surface of the semiconductor body and the temperature of the surface. In the presently preferred embodiment, in which aluminum is used as both the solvent metal and active impurity, the amount of silicon which will be dissolved by a predetermined amount or weight of aluminum at a given temperature can be readily determined by referring to the binary phase diagram for the alloy of aluminum and silicon which appears at page 284 of the "Metals Reference Book," by Mithalls, published by New York Interscience Publishers Inc. (1949 edition), which is substantially reproduced in Fig. 5. From the binary phase diagram for aluminum-silicon alloy, it may be seen that the range of fusion temperatures at which the present method is operable must be between the eutectic temperature of aluminum-silicon, which is 577° C., and the melting point of silicon, which is 1450° C. By referring to Fig. 5, it may be seen that a layer of molten aluminum upon the surface of a silicon crystalline body, which has a surface temperature of 600° C., will dissolve an amount of silicon equal in weight to approximately 14% of the weight of aluminum. At 800° C., dissolved silicon will constitute about 28% of the weight of the molten aluminum which is in phase equilibrium with the solid silicon body. It has been found in practicing the method of the present invention that a temperature range between 700° C. and 900° C. is preferable when aluminum is used as a solvent metal and active impurity with a silicon body. Above the temperature of 900° C., penetration of the molten aluminum into the solid silicon body is rapid and excessive, causing difficulty in control and decrease in the lifetime of the carriers at the junction, which results in a decrease of forward current possible through the junction. If a fusion temperature near the eutectic temperature of the alloy is used, the rate of evaporation of the solvent metal onto the silicon surface becomes overly critical, as will be described in greater detail hereinafter. Thus, for aluminum, difficulty is encountered at fusion temperatures below approximately 700° C.

The thickness of the layer of molten solvent metal evaporated onto the surface of the semiconductor body must be substantial in order to form a fused P–N junction by the present method. In practicing this invention, evaporated thicknesses from 0.2 to 10 mils have yielded satisfactory P–N junctions in the presently preferred embodiment. From the foregoing discussion it is apparent that the thickness of the P-type region, which is regrown when aluminum is used as the solvent metal, is a function of the weight of aluminum present and the temperature of the silicon surface, since at a given temperature the amount of silicon dissolved by the aluminum is a percentage by weight of the aluminum present. Using the binary phase diagram for the monatomic semiconductor material and solvent metal used, one skilled in the art can construct a curve such as that shown in Fig. 6 for silicon and aluminum, which shows the ratio of the volume of the silicon regrown region to the volume of aluminum present for any given temperature in the range of operable temperatures, assuming equilibrium conditions are maintained throughout the process. For example, from Fig. 6, it may be seen that at 800° C. the regrown crystal region will be 0.3 times the volume or thickness of the molten aluminum evaporated onto the silicon surface, while at 900° it will be nearly 0.5 times. Thus, if a thickness of 5 mils of aluminum is evaporated onto the surface of the silicon body at 900° C., a regrown region which is 2.5 mils in thickness will be formed.

The third critical parameter in the method of the present invention is the rate of evaporation of the solvent metal and active impurity onto the surface of the semiconductor body. At a relatively high temperature of fusion, i. e. 800° C. in the described embodiment, the rate of evaporation is less critical than at a fusion temperature near the eutectic point of the semiconductor material and solvent metal alloy, since the rate of penetration is greater at the higher temperature. The rate of evaporation may be easily determined, in view of what has been hereinbefore discussed, by routine experiment for particular conditions of one skilled in the art. It has been found in using aluminum and silicon that a rate of evaporation onto the silicon surface of less than 1/100 mil/sec. at fusion temperatures below 800° C. will not yield satisfactory results, while obviously there is no upper limit on the evaporation rate.

Although the reasons are not clearly known, it should be noted that the difficulties due to the presence of silicon oxides which are encountered in prior art methods for producing fused P–N junctions in silicon bodies are not encountered in practicing the method of the present invention.

The production of a fused junction silicon diode according to the method of the present invention may be described in some detail to further illustrate the applicability of the present invention.

Figure 3:
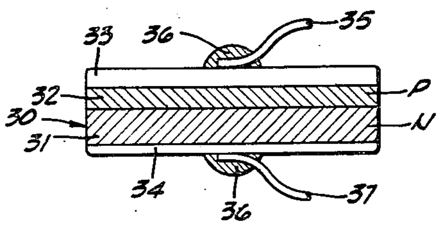
Fig. 3 is a schematic diagram in section of a completed fused junction semiconductor diode produced from the partially completed fused junction semiconductor device shown in Fig. 2.

Referring now to Figs. 1 and 3, in the production of a fused junction diode, a broad area ohmic back contact may be created on the single crystal silicon body 30 by utilizing the apparatus hereinbefore described and shown in Fig. 1. For illustration, this silicon body is again assumed to be N-type. A predetermined quantity of gold antimony, which is specifically ½ of 1% antimony is wrapped around the tungsten filament 24. For producing an ohmic contact on the N-type silicon, a solvent metal containing a donor impurity, such as antimony, phosphorus, or arsenic, of which antimony is preferable, is used. The donor impurity will, of course, not change the conductivity type of an N-type semiconductor. In practicing the present method, gold has proven eminently successful as a solvent metal. It will be apparent to one skilled in the art that gold containing an acceptor type of material may similarly be used to produce an ohmic contact on P-type silicon or germanium.

Referring to Fig. 3, the silicon body 30, having a thickness of the order of .025" and a diameter of approximately 1", which has been cut and etched as described hereinbefore, is placed on the heating platform 16 beneath the filament 24. The vacuum chamber is sealed and evacuated to a pressure of approximately $10^{-4}$ millimeters of mercury by the vacuum pump 14. The temperature of the heating platform 16 is raised by means of the source of electric current 20 until the upper surface of the silicon body is at a temperature above the eutectic temperature of gold antimony silicon, which is 370° C. In this embodiment, a temperature of approximately 500° C. is used.

The filament 24 is raised in temperature by means of the source of electric current 26. A current of approximately 20 amps is used to heat the filament sufficiently to cause the gold antimony to wet the tungsten. The current is then raised to approximately 30 amps, causing the gold antimony to evaporate from the filament and deposit on the upper surface of the silicon body 30. It has been found that the rate of evaporation onto the surface of the silicon body is not important in affecting the perfection of the final ohmic contact, although at the amperage given above, the rate of evaporation is approximately 2/100 mg./cm.$^2$/sec. Therefore, the time required to evaporate the gold antimony onto the silicon surface is not critical in forming the ohmic contact and it has been found that the thickness of the evaporated film 34 need not be greater than approximately 500 angstrom units since a film of this thickness produces substantially perfect ohmic contact over any desired area. The film thickness is calculated from measurements which show the evaporation of approximately 2 mg./cm.$^2$ of material onto the silicon surface. For the purpose of providing an ohmic contact, it is necessary only that there be fusion between the solvent metal and the semiconductor body to insure electrical continuity. The antimony, or active impurity of the conductivity class opposite to that used to form the fused junction, is used to prevent the possibility of providing another rectifying junction besides the rectifying junction that is to be formed.

After evaporation of the gold antimony from the filament 34 onto the N-type silicon crystal, the silicon is allowed to cool to room temperature, preferably at a controlled rate of cooling.

The silicon body is then turned over on the heating platform 16 and a substantial thickness of aluminum is evaporated onto the surface of the N-type silicon body opposite the surface to which the ohmic contact 34 has been affixed. The aluminum or combined solvent metal and active impurity, is evaporated onto the silicon body as described hereinbefore to form a P–N junction and regrown P-type crystal region 32 by observing the three critical parameters of fusion temperature, rate of evaporation, and thickness of the aluminum evaporated onto the silicon surface. The regrown P-type crystal region is of the order of ⅓ mil in the present embodiment. The aluminum silicon eutectic layer 33 of approximately 1 mil thickness is used as an ohmic connection to the regrown crystal region 32.

After creating the ohmic contact 34 and regrown crystal region 32 on the N-type silicon region 31, the silicon body 30 may be divided into a plurality of semiconductor bodies having rectifying areas of any predetermined size, or the complete semiconductor body may be used to produce a diode having a rectifying area equal to the total area of the P–N junction produced. For example, a silicon body used in the illustrative embodiment may be cut or diced into squares which are ⅛" on a side, to produce 40 semiconductor diodes or rectifiers. However, if the complete semi-conductor body is utilized to produce a power rectifying diode having a rectifying area 1 inch in diameter, a conductor 35 may be readily affixed to the surface of the aluminum silicon eutectic layer 33 by means of a thermosetting gold paste 36, solder, or other means well known to the art. The difficulty encountered in prior art devices in making ohmic contact to a regrown region are avoided since the layer of aluminum silicon eutectic formed by the method of the present invention makes excellent ohmic contact with the regrown region to which it is affixed.

A second conductor 37 is affixed to the ohmic connection 34 on the opposite side of the silicon body. It has been found that in an embodiment utilizing a rectifying area as large as that described herein, the use of gold paste rather than a soldered connection may be preferable, due to the increased current carrying capabilities. A power diode produced by the method of the present invention utilizing a circular rectifying area 1" in diameter has exhibited excellent electrical and current carrying characteristics.

It will be apparent to one skilled in the art that the method disclosed herein for the formation of fused P–N junctions and ohmic contacts may be utilized to produce other fused junction semiconductor devices and is especially adaptable to the production of high power fused junction transistors. The use of the method is especially advantageous in the production of fused junction transistors having very close spacing between the emitter and collector regions, due to the precision control of the thickness of the regrown crystal region and the exceptionally planar fused junction.

Transistors with such configurations are desired because of their excellent characteristics, particularly high current application.

Figure 4:
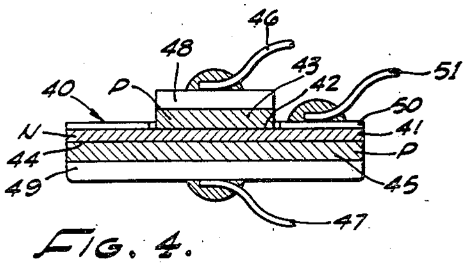
Fig. 4 is a schematic diagram, partly in section, of a completed fused junction semiconductor transistor produced by the method of the present invention.

Referring to Fig. 4, a fused junction P–N–P transistor 40 produced by the method of the present invention is shown schematically, and includes an N-type base region 41, a P–N emitter junction 42 defined by a first regrown P-type crystal region 43, and a P–N collector junction 44 defined by a second regrown crystal region 45.

The first P-type regrown crystal region 43 is formed as described hereinbefore on an N-type silicon crystal body having any desired area, to produce an emitter junction 42 and P-type regrown region. Since the emitter junction area 42 of a transistor preferably is less than the area of the collector junction 44, as shown in Fig. 4, masking techniques may be used to confine the P-type regrown crystal region to a portion of the total surface area of the N-type semiconductor body portion 41. After completing the emitter junction 42 and first P-type regrown region 43, the collector junction 44 and second P-type regrown region 45 are formed by turning the silicon body over on the heating platform 16 of Fig. 1, and performing the same method of forming a fused P–N junction on the total area of the second side of the silicon body which is opposed to the side on which the first P–N junction is formed. Masking techniques are again used to evaporate a gold antimony ohmic contact 50 onto the portion of the first side of the semiconductor body over which the P–N junction 42 was not formed and which forms the base.

Lead wires 46, 47 are ohmically connected by means of thermosetting gold paste, or other means well known to the art, to the aluminum silicon eutectic regions 48, 49 which are ohmically affixed to the first and second regrown P-type regions, respectively. Another lead wire 51 is connected, by gold paste, solder, or other means well known to the art, to the ohmic contact region 50 which is fused to the N-type region 41 of the silicon body forming the base as previously described. The completed P–N–P fused junction silicon transistor shown in Fig. 4 is characterized by current amplification which closely approaches unity because of the extremely close spacing between emitter and collector regions, and also has other improved electrical characteristics due to the planar P–N junctions. In addition, the fused junction silicon transistor produced by the method of the present invention has greatly increased current carrying capabilities due to the size of the P–N junctions which can be formed.

Although in the foregoing description the formation of fused P–N junctions using silicon bodies and aluminum as a combined solvent metal and active impurity has been particularly described, it will be apparent to those skilled in the art that other metals may be used as solvent metals, including gold, platinum, silver, and tin. The active impurity combined with or present in the solvent metal may also be varied according to the use of the method and the semiconductor devices desired, in that donor impurities, such as phosphorus, arsenic, and antimony, may be used to produce an N-type regrown region on a P-type monatomic semiconductor body, while acceptor impurities, such as boron, aluminum, gallium, and indium, may be used to produce fused P–N junctions on N-type monatomic semiconductor bodies.

Thus, the method disclosed herein makes possible the production of fused P–N junctions on monatomic semiconductor bodies which are greatly increased in area over those fused junctions which it has heretofore been possible to manufacture by methods of the prior art, and which are, by the present method, limited in area only by the surface area of the monatomic semiconductor body. In addition, the method of the present invention provides fused P–N junctions which are exceptionally planar in configuration. This, combined with the precision control of the thickness of the regrown region which is produced to form the fused P–N junction, makes possible the production of fused junction transistors having electrical characteristics which are superior to transistors heretofore possible by methods known to the prior art. The increased area of P–N junctions in turn provides semiconductor devices which are capable of current carrying capacities far in excess of those known in the present state of the art.

What is claimed is:

1. The method of producing an integral P-type regrown crystal region upon a surface of an N-type silicon body, comprising the steps of: positioning a mass of aluminum proximate a surface of said silicon body; heating the silicon body to a temperature above the eutectic temperature of silicon and aluminum and below the melting point of silicon; evaporating said aluminum onto substantially the entire area of said surface of said silicon body to form a layer of molten aluminum of substantial thickness of at least 0.2 mil on said surface, whereby a layer of said surface of said silicon body is dissolved in said layer of molten aluminum to form a molten solution which is substantially at thermodynamic equilibrium; and cooling said silicon body to cause the dissolved silicon to precipitate, together with some atoms of said aluminum, upon the N-type silicon body to form an integral P-type regrown silicon region separated from said body by a P–N junction formed at the interface between the silicon body and the molten solution.

2. The method of producing an integral regrown crystal region of one conductivity type upon a surface of a monatomic semiconductor crystal body of silicon of a conductivity type opposite to that of the regrown crystal region, comprising the steps of: positioning a mass of solvent metal containing an active impurity proximate a surface of said semiconductor body, said active impurity being of the type which determines the conductivity type of the integral regrown crystal region; heating said semiconductor body to a temperature above the eutectic temperature of the material of said semiconductor body and said solvent metal and below the melting point of the material of said semiconductor body; evaporating said solvent metal onto substantially the entire area of said surface of said semiconductor body to form a molten layer of said solvent metal on said surface, said molten layer deposited on said surface having a substantial thickness of at least 0.2 mil, said solvent metal being evaporated onto said surface at a predetermined rate of deposition of at least $\frac{1}{100}$ mil in thickness per second, whereby a layer of the surface of said semiconductor body is dissolved in the layer of solvent metal to form a molten solution which is substantially at thermodynamic equilibrium; and cooling the semiconductor body to cause the dissolved semiconductor material to precipitate, together with some atoms of the active impurity, upon said semiconductor body to form an integral regrown crystal region of a conductivity type opposite to that of said semiconductor body and separated from said body by a P–N junction formed at the interface between the silicon body and the molten solution.

3. The method of producing a broad area fused P–N junction upon an N-type semiconductor crystal body of silicon, comprising the steps of: positioning a mass of aluminum proximate a surface of said semiconductor body selected from the group consisting of germanium and silicon; heating said semiconductor body to a temperature above the eutectic temperature of the material of said semiconductor body and aluminum and below the melting point of the material of said semiconductor body; evaporating said aluminum onto substantially the entire area of said surface of said semiconductor body to form a molten layer of said aluminum upon said surface, said molten layer having a thickness of at least 0.2 mil, said aluminum being evaporated at a predetermined rate of deposition upon said surface of at least $\frac{1}{100}$ mil in thickness per second, whereby a layer of the surface of said semiconductor body is dissolved in said layer of aluminum to form a molten solution which is substantially at thermodynamic equilibrium; and cooling said semiconductor body to cause the dissolved semiconductor material to precipitate, together with some atoms of aluminum, upon said semiconductor body to form an integral regrown crystal region of a conductivity type opposite to that of the semiconductor body and separated from said body by a P–N junction formed at the interface between the silicon body and the molten solution.

4. The method of producing a broad area fused P–N junction upon an N-type silicon body, comprising the steps of: positioning a mass of aluminum proximate a surface of said silicon body; heating said silicon body to a temperature above the eutectic temperature of silicon and aluminum and below the melting point of silicon; evaporating said aluminum onto substantially the entire area of said surface of said silicon body to form a molten layer of aluminum upon said surface, said molten layer having a thickness of at least 0.2 mil, said aluminum being evaporated at a predetermined rate of deposition upon said surface of at least $\frac{1}{100}$ mil in thickness per second, whereby a layer of the surface of said silicon body is dissolved in said molten layer of aluminum to form a molten solution which is substantially at thermodynamic equilibrium; and cooling said silicon body to cause the dissolved silicon to precipitate, together with some atoms of aluminum, upon said silicon body to form an integral regrown crystal region of a conductivity type opposite to that of said silicon body and separated from said body by a P–N junction formed at the interface between the silicon body and the molten solution and a layer of aluminum-silicon eutectic ohmically affixed to said P-type regrown region.

5. The method of producing a broad area fused P–N junction upon an N-type silicon body, comprising the steps of: positioning a mass of aluminum proximate a surface of said silicon body; heating said silicon body to a temperature in the range of approximately 700° C. to 900° C.; evaporating said aluminum onto substantially the entire area of said surface of said silicon body to form a molten layer of aluminum upon said surface, said molten layer being of a thickness between 0.2 mil and 10 mils, said aluminum being evaporated at a predetermined rate of deposition upon said surface of at least $\frac{1}{100}$ mil in thickness per second, whereby a layer of the surface of said silicon body is dissolved in said molten layer of aluminum to form a molten solution which is substantially at thermodynamic equilibrium; and cooling said silicon body to cause the dissolved silicon to precipitate, together with some atoms of aluminum, upon said silicon body to form an integral regrown crystal region of a conductivity type opposite to that of said silicon body separated from said body by a P–N junction formed at the interface between the silicon body and the molten solution.

6. The method of producing a broad area fused P–N junction in an N-type silicon body comprising the steps of: positioning a heating filament proximate and above a surface of said silicon body, affixing a mass of aluminum to said filament surface; heating said silicon body to a temperature in the range of 700–900° C.; heating said filament to evaporate said aluminum therefrom and onto substantially the entire area of said surface of said silicon body to form a molten layer of aluminum upon said surface, said mass of aluminum being sufficient to form said molten layer to a thickness of from 0.2 to 10 mils, said aluminum being evaporated at a predetermined rate of deposition upon said surface of at least $\frac{1}{100}$ mil in thickness per second, whereby a layer of said surface of said silicon body is dissolved in said layer of molten aluminum to form a molten solution which is substantially at thermodynamic equilibrium; and cooling said silicon body at a substantially constant and predetermined rate to cause the dissolved silicon to precipitate, together with some atoms of said aluminum, upon said N-type silicon body to form an integral P-type regrown silicon region and separated from said body by a P–N junction formed at the interface between the silicon body and the molten solution.

7. A broad area fused junction silicon diode produced by the method of: heating an N-type silicon body to a temperature above the eutectic temperature of silicon and aluminum and below the melting point of silicon; evaporating a molten layer of substantial thickness of at least 0.2 mil of aluminum onto substantially the entire area of a first surface of said silicon body, whereby a layer of said surface of said silicon body is dissolved in said layer of aluminum to form a molten solution which is substantially at thermodynamic equilibrium; cooling said silicon body to cause the dissolved silicon to precipitate, together with some atoms of aluminum, upon said N-type silicon body to form an integral regrown P-type silicon region separated from said body by a P–N junction formed at the interface between the silicon body and the molten solution and a layer of aluminum silicon eutectic ohmically affixed to said P-type regrown region; evaporating a film of gold containing antimony as an active impurity upon a second surface of said N-type silicon body, said second surface being opposed to said first surface of said silicon body; ohmically connecting an electrode to the surface of said aluminum-silicon eutectic; and ohmically connecting a second electrode to the surface of said gold-antimony film.

8. A broad area fused junction transistor produced by the method comprising the steps of: heating an N-type silicon body to a temperature above the eutectic temperature of silicon and aluminum and below the melting point of silicon; evaporating a molten layer of substantial thickness of at least 0.2 mil of aluminum onto substantially the entire area of a first surface of said silicon body, cooling said silicon body to cause dissolved semiconductor material to precipitate, together with some atoms of aluminum, upon said first surface of said silicon body to form a first integral P-type regrown silicon region separated from said body by a P–N junction formed at the interface between the silicon body and the molten solution and first aluminum-silicon eutectic region ohmically affixed to said first regrown silicon region; heating said silicon body to a temperature above the eutectic temperature of aluminum and silicon and below the melting point of silicon; evaporating a molten layer of substantial thickness of at least 0.2 mil of aluminum onto substantially the entire area of a second surface of said silicon body opposed to said first surface to form a molten solution which is substantially at thermodynamic equilibrium, cooling said silicon body to cause dissolved semiconductor material to precipitate, together with some atoms of said aluminum, upon said second surface of said silicon body to form a second integral P-type regrown silicon region separated from said body by a P-N junction formed at the interface between the silicon body and the molten solution, and a second aluminum-silicon eutectic region ohmically affixed to said second regrown P-type silicon region; affixing a first electrode to the surface of said first aluminum-silicon eutectic region; ohmically affixing a second electrode to the surface of said second aluminum-silicon eutectic region; and affixing a third electrode to said N-type silicon region.

References Cited in the file of this patent

UNITED STATES PATENTS

| | | |
|---|---|---|
| 2,561,411 | Pfann | July 24, 1951 |
| 2,695,852 | Sparks | Nov. 30, 1954 |
| 2,701,326 | Pfann et al. | Feb. 1, 1955 |
| 2,736,847 | Barnes | Feb. 28, 1956 |